(12) United States Patent
Codega et al.

(10) Patent No.: US 11,460,875 B2
(45) Date of Patent: Oct. 4, 2022

(54) BANDGAP CIRCUITS WITH VOLTAGE CALIBRATION

(71) Applicant: MARVELL ASIA PTE, LTD., Singapore (SG)

(72) Inventors: Nicola Codega, Santa Clara, CA (US); Fabio Giunco, Santa Clara, CA (US); Giovanni Cesura, Santa Clara, CA (US)

(73) Assignee: MARVELL ASIA PTE LTD., Singapore (SG)

( * ) Notice: Subject to any disclaimer, the term of this patent is extended or adjusted under 35 U.S.C. 154(b) by 105 days.

(21) Appl. No.: 16/809,358

(22) Filed: Mar. 4, 2020

(65) Prior Publication Data
US 2020/0201375 A1 Jun. 25, 2020

Related U.S. Application Data

(63) Continuation-in-part of application No. 16/222,929, filed on Dec. 17, 2018, now Pat. No. 10,613,570.

(51) Int. Cl.
*G05F 3/30* (2006.01)
*H03L 7/08* (2006.01)

(52) U.S. Cl.
CPC . *G05F 3/30* (2013.01); *H03L 7/08* (2013.01)

(58) Field of Classification Search
CPC .......... G05F 3/262; G05F 3/265; G05F 3/242; G05F 3/30; H03L 7/08
See application file for complete search history.

(56) References Cited

U.S. PATENT DOCUMENTS

| 5,629,611 A | 5/1997 | McIntyre |
| 6,160,391 A | 12/2000 | Banba |
| 6,933,770 B1 | 8/2005 | Ranucci |
| 7,164,259 B1 | 1/2007 | Megaw et al. |
| 7,453,252 B1 | 11/2008 | Megaw |
| 7,821,331 B2 | 10/2010 | Krishna |

(Continued)

OTHER PUBLICATIONS

"High-Speed DACs" Application Note, Tektronix, Jul. 2014 (Year: 2014).*

(Continued)

*Primary Examiner* — Kyle J Moody
*Assistant Examiner* — Jye-June Lee

(57) ABSTRACT

A bandgap circuit generates a substantially constant output voltage. The bandgap circuit can be integrated with other circuits of an integrated circuit and its absolute output voltage value can be calibrated to a desired voltage level. As such, the variation in absolute voltage levels which may be caused by variation in devices' parameters subject to different fabrication processes is minimized or substantially eliminated. The bandgap circuit includes a bandgap core that generates a temperature independent voltage. The bandgap circuit also includes a resistor ladder that is coupled in parallel to the bandgap core and scales the temperature independent voltage into voltage levels proportional to the temperature independent voltage. An output switch of the bandgap circuit selects the voltage level on the resistor ladder that is substantially equal to a desired voltage level. The bandgap circuit also includes a current mirror that outputs a proportional to absolute temperature current.

10 Claims, 5 Drawing Sheets

(56) References Cited

U.S. PATENT DOCUMENTS

| | | | |
|---|---|---|---|
| 8,008,966 B2 | 8/2011 | Cho | |
| 8,294,450 B2 | 10/2012 | Lee et al. | |
| 8,885,691 B1* | 11/2014 | Ren | G05F 1/10 |
| | | | 375/219 |
| 9,692,448 B1* | 6/2017 | Kong | G05F 3/16 |
| 2009/0237150 A1 | 9/2009 | Tsai et al. | |
| 2014/0218123 A1* | 8/2014 | Wei | H03B 5/04 |
| | | | 331/176 |
| 2015/0301539 A1* | 10/2015 | Dang | G05F 1/468 |
| | | | 327/537 |
| 2018/0069531 A1* | 3/2018 | Wang | H03L 7/00 |

OTHER PUBLICATIONS

David C.W. Ng, David K.K. Kwong, Ngai Wong, "A 30μW CMOS bandgap reference featuring a 1.5-6mA output driving current and a Miller-effect startup circuit," Microelectronics Journal, vol. 40, Issue 11, 2009, pp. 1514-1522 (Year: 2009).*

* cited by examiner

BANDGAP CIRCUITS WITH VOLTAGE CALIBRATION

CROSS-REFERENCES TO RELATED APPLICATIONS

The present invention is a continuation-in-part application to U.S. patent application Ser. No. 16/222,929, filed on 17 Dec. 2018, entitled "BANDGAP CIRCUITS WITH VOLTAGE CALIBRATION", which is incorporated by reference herein for all purposes.

BACKGROUND OF THE INVENTION

This disclosure pertains in general to integrated circuits, and more specifically to bandgap reference voltage calibration.

Bandgap circuits generate voltages that are independent of process, temperature, and voltage supply (PVT variations) and are vastly used in integrated circuits. However, the output voltage of a bandgap circuit may drift as a result of any variation in fundamental parameters: threshold voltages of transistors, resistor ratios, or geometrical parameters. Consequently, reference voltages derived from its output voltage will also be inaccurate, which may cause these integrated circuits to incur substantial operation errors. It is important to ensure that output voltages of bandgap circuit have a flat profile over PVT.

BRIEF SUMMARY OF THE INVENTION

A bandgap circuit generates a process, power supply, and temperature independent output voltage. The bandgap circuit can be integrated with other circuits of an integrated circuit (IC) and its absolute output voltage value can be calibrated to a desired voltage level. As such, the variation in absolute voltage levels which may be caused by variation in devices' parameters subject to different fabrication processes is minimized or substantially eliminated. The bandgap circuit includes a bandgap core that generates a temperature independent voltage. The bandgap circuit also includes a resistor ladder that is coupled in parallel to the bandgap core and scales the temperature independent voltage into voltage levels proportional to the temperature independent voltage. An output switch of the bandgap circuit selects the voltage level on the resistor ladder that is substantially equal to a desired voltage level. The bandgap circuit also includes a current mirror that outputs a proportional to absolute temperature (PTAT) current.

Other aspects include components, devices, systems, improvements, methods, processes, applications and other technologies related to the foregoing.

BRIEF DESCRIPTION OF THE DRAWINGS

The teachings of the embodiments disclosed herein can be readily understood by considering the following detailed description in conjunction with the accompanying drawings.

DETAILED DESCRIPTION OF THE INVENTION

The Figures and the following description relate to various embodiments by way of illustration only. It should be noted that from the following discussion, alternative embodiments of the structures and methods disclosed herein will be readily recognized as viable alternatives that may be employed without departing from the principles discussed herein. Reference will now be made in detail to several embodiments, examples of which are illustrated in the accompanying figures. It is noted that wherever practicable similar or like reference numbers may be used in the figures and may indicate similar or like functionality.

Figure 1:
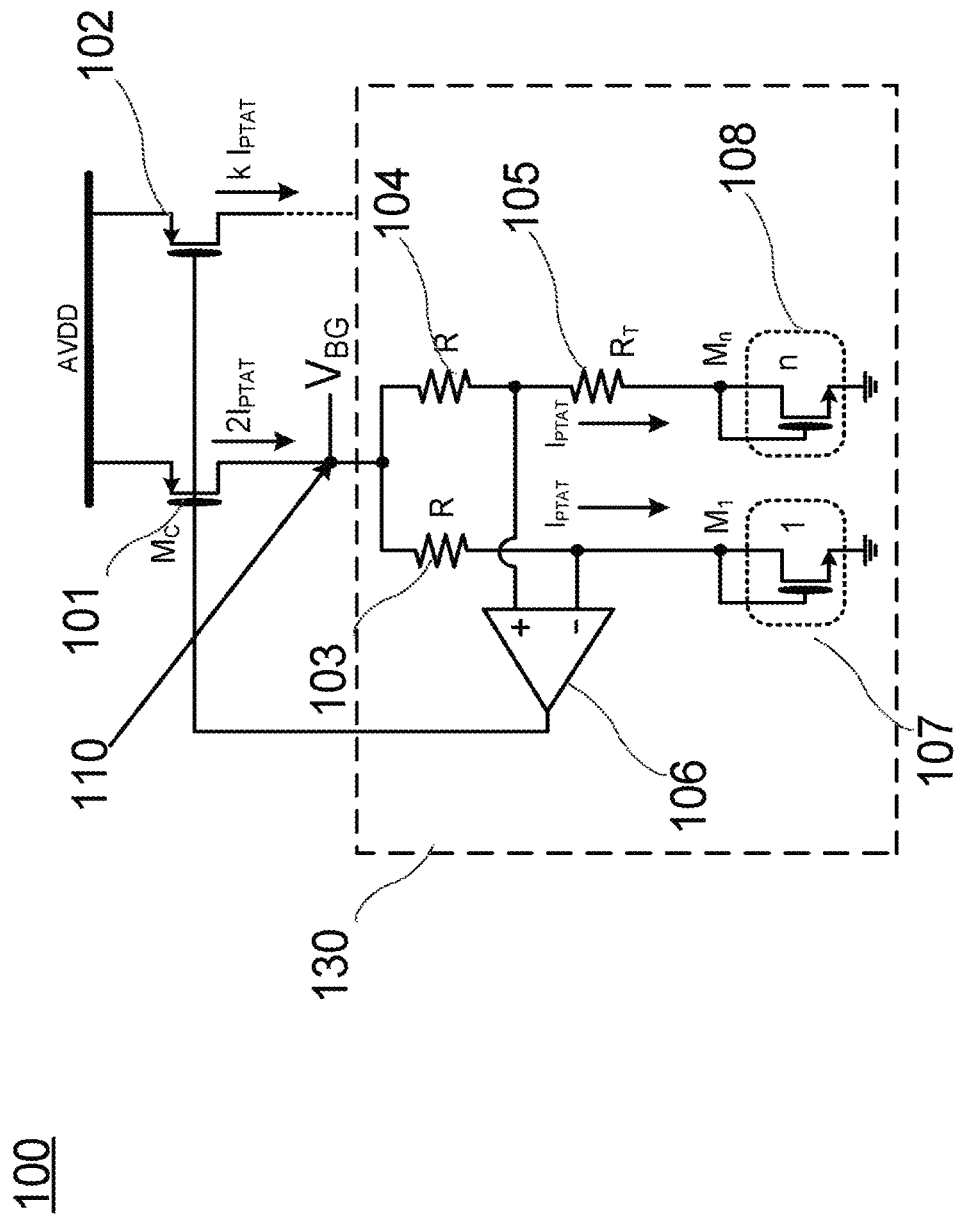
FIG. 1 illustrates an example bandgap circuit.

FIG. 1 illustrates an example bandgap circuit 100. As illustrated, the example bandgap circuit 100 includes transistors 101-102, resistors 103-105, an operational amplifier (Op Amp) 106, and transistors 107-108. The transistors 101-102 are P-type Metal-Oxide-Semiconductor (PMOS) transistors, and the transistors 107-108 are N-type Metal-Oxide-Semiconductor (NMOS) transistors. The bandgap core 130 that outputs a bandgap voltage $V_{BG}$ includes the resistors 103-105, Op Amp 106, and transistors 107-108. As described herein, the bandgap voltage $V_{BG}$ is a temperature independent voltage. The bandgap core 130 can be integrated in integrated circuits to provide the bandgap voltage $V_{BG}$ regardless of power supply variations, temperature changes, and circuit loading of the integrated circuits. Compared to using external voltage references, integrated bandgap circuits are less noisy, less power-hungry, and provide a wider voltage range that is less susceptible to temperature.

The transistor 107 is coupled in series with a resistor 103, which is further referred to as the first branch. The transistor 108 is coupled in series with resistors 104-105, which is further referred to as the second branch. The transistor 108 is n-times bigger than the transistor 107 in dimension. That is, the current capability and the amplification factor of the transistor 108 is n-times of that of the transistor 107. The two branches are connected in parallel between the ground and the transistor 101. The resistors 103 and 104 are equal and both coupled to the transistor 101 which is further coupled to the power supply voltage. The Op Amp 106 forces its positive and negative inputs to be at the same voltage. As a result, the currents flowing through the resistors 103-104 are equal. The currents flowing through the transistors 107 and 108 are also equal. The transistors 107 and 108 are of different dimensions: the transistor 108 is n times bigger than the transistor 107. Hence, the gate to source threshold voltage of the transistor 107 is higher than that of the transistor 108. In the second branch, this threshold voltage difference between the transistors 107 and 108 is equal to the voltage drop over the resistor 105. From physics, this threshold voltage difference is proportional to absolute temperature. The current flowing through the resistor 105 equals to this voltage drop divided by the resistance of the resistor 105. Therefore this current is proportional to absolute temperature (PTAT) current $I_{PTAT}$. In the illustrated example, the transistors 107 and 108 are selected such that the temperature coefficient of the threshold voltage difference between the transistors 107, 108 multiplied by a factor is the opposite of that of the threshold voltage of the transistor 107. For example, the threshold voltage of the transistor 108 has a temperature coefficient of −2 mV/K and the threshold voltage difference between the transistors 107, 108 multiplied by an appropriate factor can have the opposite temperature coefficient of +2 mV/K. As such, if the temperature varies, the variation in the voltage across the resistor 104 counteracts the transistor 108 voltage variation. The voltage $V_{BG}$ is therefore substantially constant and temperature independent.

The transistor 101 is controlled to provide the current through both branches. In the illustrated example, the transistor 101 is controlled by a feedback loop including the Op Amp 106. The feedback loop is configured to compare the voltage on both branches and to control the transistor 101 to equalize the current flowing through both branches. The bandgap circuit 100 outputs an output voltage $V_{BG}$ at the node 110. The output voltage $V_{BG}$ is the power supply voltage minus the voltage drop across the transistor 101. Because the current flowing through both branches is substantially equal and substantially proportional to absolute temperature, the bandgap circuit 100 outputs the output voltage $V_{BG}$ that is substantially constant and temperature independent.

The bandgap circuit 100 can further output a current that is proportional to absolute temperature (PTAT). For example, in the illustrated example, the transistor 102 is configured to output an output current. The transistors 101 and 102 are connected to form a current mirror. The current through the transistor 102 mirrors the current through the transistor 101.

For the topology illustrated in FIG. 1, the absolute value of the output voltage $V_{BG}$ may vary from one circuit to another, however keeping the temperature independence. This variation in the output voltage absolute value is caused by variation in individual devices (e.g., Bipolar Junction Transistors (BJTs), metal-oxide semiconductor field-effect transistor (MOSFETs), resistors, Op Amps) used in different circuits, even though the output voltage $V_{BG}$ of a circuit can be temperature independent. For example, devices manufactured by different fabrication processes may have different parameters. To substantially minimize or eliminate this variation in the absolute value of the output voltage $V_{BG}$ generated by bandgap circuits that employ different individual devices manufactured by different fabrication processes, the bandgap circuits are calibrated. One example is described in connection with FIG. 2.

Figure 2:
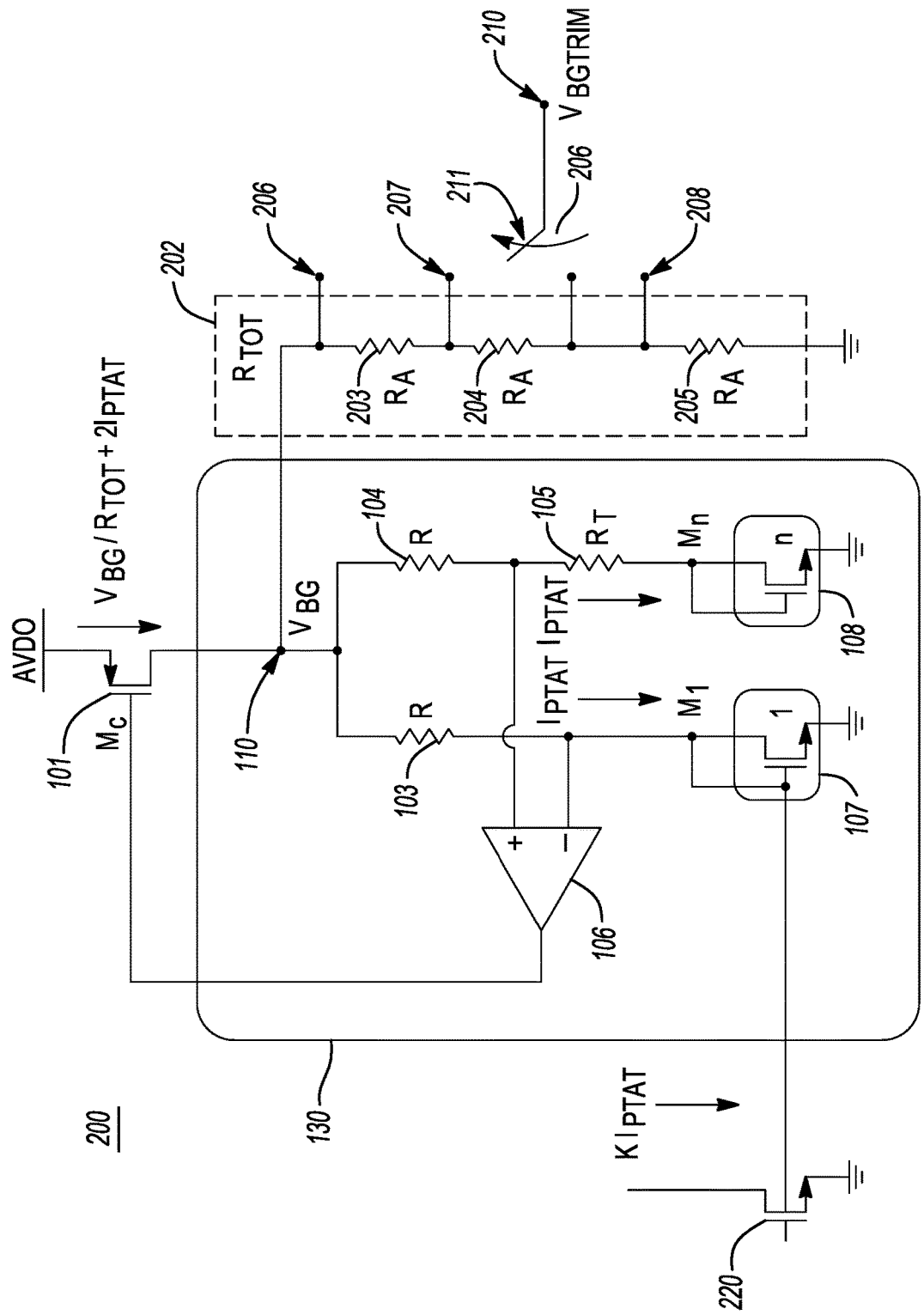
FIG. 2 illustrates an example bandgap circuit, according to one embodiment.

FIG. 2 illustrates an example bandgap circuit 200 that outputs a calibrated voltage. That is, the output voltage of the bandgap circuit 200 can be calibrated to a desired voltage level. The bandgap circuit 200 includes the transistor 101, a bandgap core 130, a resistor ladder 202, an output switch 206, and a transistor 220. The transistor 101 and the bandgap core 130 are described above in connection with FIG. 1. In the illustrated example, the transistor 220 is a NMOS transistor. The example bandgap circuit 200 can be integrated in many systems, such as Serializer/Deserializers and memories.

The resistor ladder 202 scales the output voltage and includes multiple resistors connected in series. In the illustrated example, three resistors 203, 204, 205 are connected in series. The resistor ladder 202 is coupled in parallel to the output of the bandgap core 130. As illustrated, one terminal of the resistor ladder 202 (i.e., one terminal of the resistor 203) is coupled to the node 110 of the bandgap core 130. The other terminal of the resistor ladder 202 (i.e., one terminal of the resistor 205) is grounded. In the illustrated example, the resistor ladder 202 divides the output voltage $V_{BG}$ of the bandgap core 130 into three equal portions each of which is the voltage across an individual resistor 203, 204, 205. That is, the voltage across the resistor 205 (204 or 203) is $\frac{1}{3}V_{BG}$.

The output switch 206 switches between different voltage levels. The terminal 210 of the switch 206 is the output terminal of the bandgap circuit 200. The other terminal 211 of the switch 206 can switch between the three taps 206, 207, 208. The three taps 206, 207, 208 are connected to a first terminal of the resistor 203, a second terminal of the resistor 203 (also a first terminal of the resistor 204), and a second terminal of the resistor 204 (also a first terminal of the resistor 205). As such, the output voltage $V_{BGTRIM}$ of the bandgap circuit 200 can be calibrated by selecting a voltage level that is proportional to the output voltage $V_{BG}$ of the bandgap circuit 200. In the illustrated example, the output voltage $V_{BGTRIM}$ of the bandgap circuit 200 can be selected from $\frac{1}{3}V_{BG}$, $\frac{2}{3}V_{BG}$, and $V_{BG}$.

The number of resistors is configured according to a desired level of voltage adjustment. In the illustrated example, the resistor ladder 202 includes only three resistors and thus the output voltage $V_{BGTRIM}$ can be calibrated by a voltage adjustment of $\frac{1}{3}V_{BG}$. To achieve an adjustment of a smaller or larger voltage level, more or fewer resistors can be used. For example, 4 resistors can be used to provide a voltage adjustment of $\frac{1}{4}V_{BG}$, and 5 resistors can be used to provide a voltage adjustment of $\frac{1}{5}V_{BG}$. In various embodiments, the resistors included in the resistor ladder have the same resistance that is in the kilo-ohm range. In one embodiment, the voltage adjustment is 5 mV.

To calibrate the output voltage $V_{BGTRIM}$ of the bandgap circuit 200, a desired voltage level is provided and compared to the different voltage levels at different taps. The tap corresponding to a voltage level that is substantially equal to the desired voltage level is selected. The switch 211 is switched to this tap. The calibration process can be performed manually or by a calibration circuit or a calibration program automatically. For example, a calibration circuit compares the output voltage $V_{BGTRIM}$ to a desired voltage level using a comparator. The desired voltage level can be provided by a voltage reference such as a voltage supply partition. One input terminal of the comparator is coupled to the voltage reference and the other input terminal is coupled to the node 210 ($V_{BGTRIM}$) of the bandgap circuit 200. The calibration circuit can switch the terminal 211 of the switch to connect to different taps of the resistor ladder 202. The calibration circuit switches select the tap corresponding to a voltage level that is closest to the desired voltage level. Calibration may substantially minimize the variation in the output voltage across different chips that is caused by devices manufactured by different fabrication processes.

The calibration can be performed either during production or during startup of a chip. For example, a chip including the bandgap circuit 200 can include a non-volatile memory that stores the desired voltage level, which is used to calibrate the bandgap circuit during production. As another example, during the initialization of a chip, an external voltage reference can be provided to calibrate the bandgap circuit, for example, by using a calibration process as described above.

The transistor 220 is configured to provide a current that is proportional to absolute temperature (PTAT). The transistor 220 is coupled to the transistor 107 to create a current mirror. That is, the current through the transistor 220 mirrors the current through the transistor 107. The current through transistor 107, 108 and 220 are all proportional to absolute temperature. Compared to the bandgap circuit 100 illustrated in FIG. 1, the current flowing through the transistor 101 of FIG. 2 additionally include the current flowing through the resistor ladder 202. The current through the transistor 101 is the sum of the current through the bandgap core 130 and the resistor ladder 202.

Compared to the bandgap circuit 100 illustrated in FIG. 1, the bandgap circuit 200 illustrated in FIG. 2 outputs a voltage that is temperature and process independent. The bandgap circuit 200 outputs a voltage $V_{BGTRIM}$ having a voltage level that can be calibrated. The output voltage $V_{BGTRIM}$ of the bandgap circuit 200 can be adjusted to be substantially consistent across different samples of the chips which may be fabricated by different fabrication processes. In addition, the resistor ladder operates independently from the bandgap core 130 and does not introduce interference or noise that may affect the flatness of the output voltage of the bandgap core 130.

Other topologies of the bandgap core 130 can also be used. For example, the MOS transistors 101, 102, 107, and 108 are be replaced with BJTs. The MOSFETs can operate in the subthreshold conduction mode (i.e., the gate-to-source voltage is below the threshold voltage). The BJT transistors can operate in the forward-active region. The BJT transistors can be NPN or PNP type.

Figure 3:
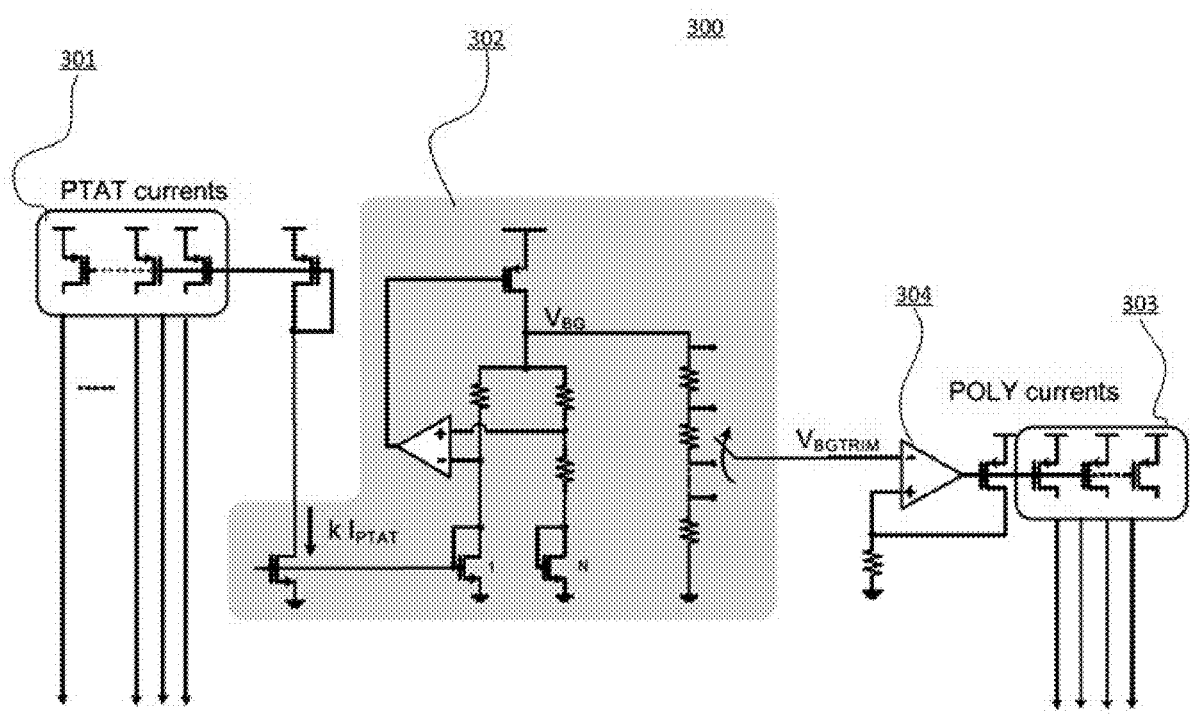
FIG. 3 illustrates a bandgap circuit coupled to control currents according to embodiments of the present invention.

FIG. 3 illustrates a semiconductor die 300 implemented with a bandgap circuit coupled to control currents according to embodiments of the present invention. This diagram is merely an example, which should not unduly limit the scope of the claims. One of ordinary skill in the art would recognize many variations, alternatives, and modifications. Semiconductor die 300 includes PTAT currents circuit 301, bandgap circuit 302, op amp 304, and POLY currents circuit 303. For example, bandgap circuit 302 can be implemented with circuit 100 illustrated in FIG. 1. As shown, the $I_{PTAT}$ current is coupled to PTAT currents circuit 301, which includes a plurality of switches configured in series, as shown. For example, $I_{PTAT}$ current is configured to be substantially constant, and PTAT currents circuit 301 utilizes a fraction or multiple of current $I_{PTAT}$, as needed. POLY currents circuits 303 is coupled, via op am 304, to voltage $V_{BGTRIM}$, which provides a selectable constant bandgap voltage $V_{BG}$, where $V_{BGTRIM}$ depends on switch position relative to the resistor ladder. POLY currents circuit 303 includes a plurality of switches configured in series, and the current at these switches is a function of both voltage $V_{BG}$ and the resistor coupled to the positive input terminal of op am 304. In various applications, circuits 301 and 303 provides fractional (or multiple) of constant current that is usable for various applications of semiconductor die 300.

Figure 4:
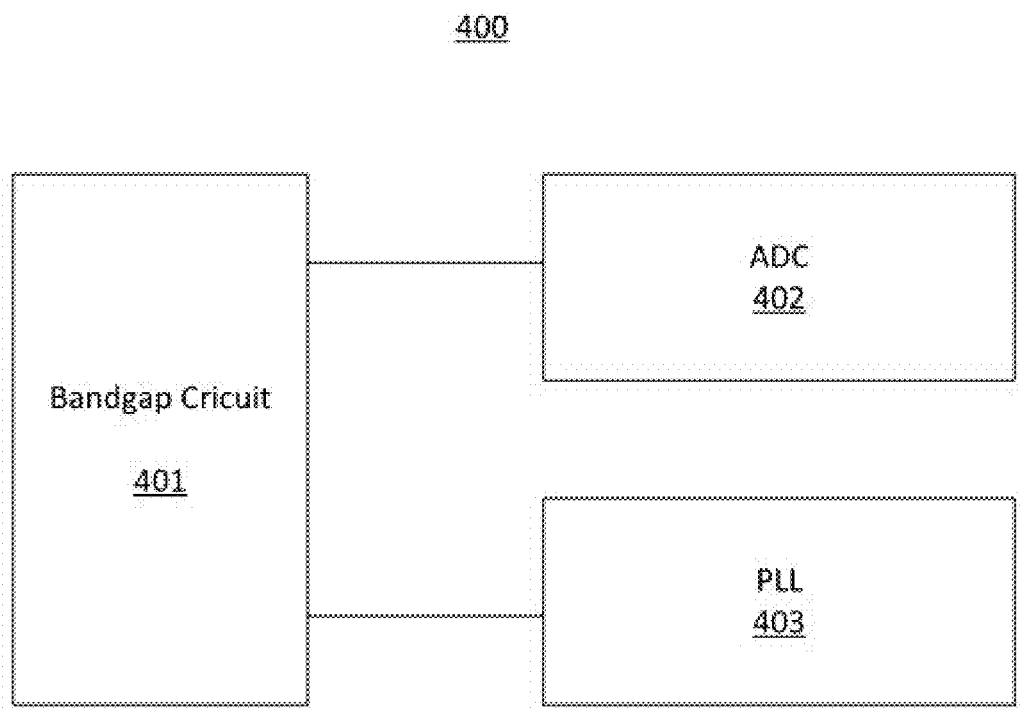
FIG. 4 illustrates a sensor circuit implemented on an integrated circuit according to embodiments of the present invention.

FIG. 4 illustrates a bandgap circuit implemented on an integrated circuit 400 according to embodiments of the present invention. This diagram is merely an example, which should not unduly limit the scope of the claims. One of ordinary skill in the art would recognize many variations, alternatives, and modifications. Integrate circuit 400 includes bandgap circuit 401, analog-to-digital converter (ADC) 402, and phase-lock loop (PLL) 403. The bandgap circuit 401 generates a constant (e.g., independent of PVT variations as explained above) current $I_{PTAT}$ and a constant voltage $V_{BG}$ (with multiple taps of voltage levels provided by a resistor ladder described in FIG. 2). The constant current $I_{PTAT}$ (as its fraction or multiple of currents) is used by the ADC 402. For example, ADC 402 uses an internal DAC for successive approximation, and the internal DAC uses the constant current generated by circuit 501 for its binary weighted current ladder. PLL 403, in a specific embodiments, utilizes the constant voltage in is voltage-controlled oscillator (VCO) to generate a stable clock signal. For example, integrated circuit 400 can be a receiver in a communication apparatus that is configured to receive and process analog signals; ADC 402 is configured to convert received analog signal to a digital signal stream using-among other components-one or more constant currents provided by circuit 401, and PLL 403 generates a steady clock signal using the constant voltage provided by circuit 401. There can be other variations as well.

Figure 5:
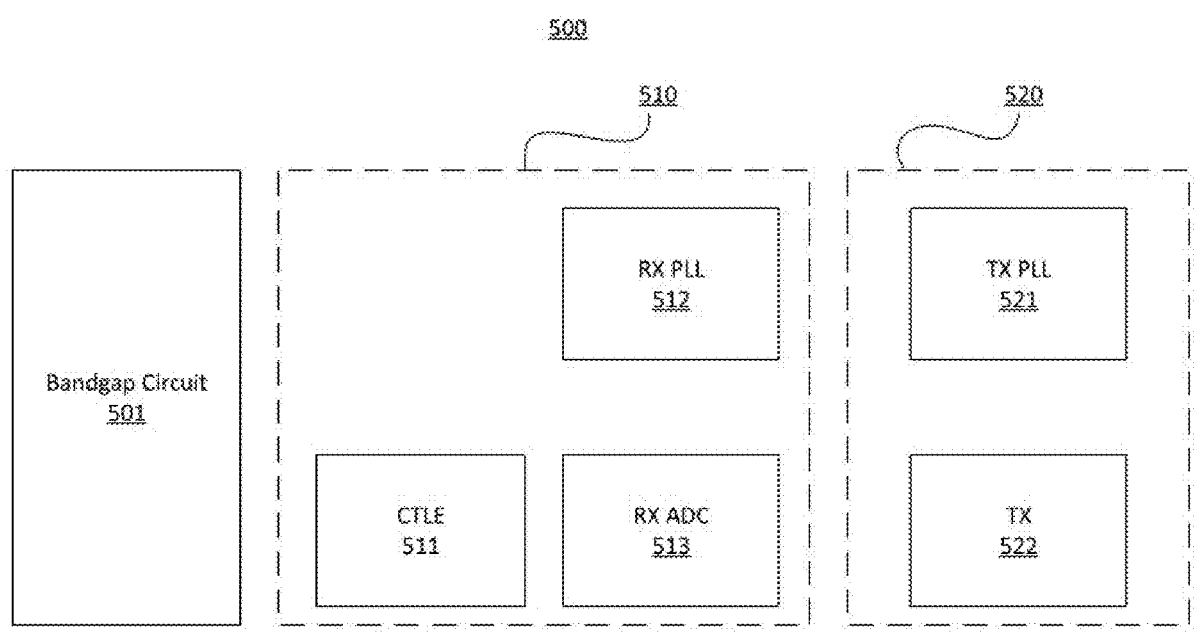
FIG. 5 illustrates a sensor circuit implement on a SerDes apparatus according to embodiments of the present invention.

FIG. 5 illustrates a sensor circuit implement on a SerDes apparatus 500 according to embodiments of the present invention. This diagram is merely an example, which should not unduly limit the scope of the claims. One of ordinary skill in the art would recognize many variations, alternatives, and modifications. SerDes apparatus 500 includes bandgap circuit 501, a receiver (RX) section 510, and a transmitter (TX) section 520. For example, between the receiver section 501 and transmitter section 520, SerDes apparatus 500 perform serialization and de-serialization of data. Bandgap circuit 501 provides a constant (e.g., independent of PVT variations as explained above) current $I_{PTAT}$ and a constant voltage $V_{BG}$ (with multiple taps of voltage levels provided by a resistor ladder described in FIG. 2), which are used by various components of SerDes apparatus 500. For example, continuous time linear equalizer (CTLE) 511 uses $I_{PTAT}$ generated by circuit 501 to perform equalization process. RX PLL 512 at section 510 and TX PLL 521 at section 520 respectively generate clock signals for sections 510 and 520, and both of them rely on the $V_{BG}$ for the their VCOs (not shown in FIG. 5) to generate stable clock signals. RX ADC 513 uses an internal DAC for successive approximation, and the internal DAC uses the constant current $I_{PTAT}$ generated by circuit 501 for its binary weighted current ladder. In various embodiment, transmitter 522 at section 520 maintains stable transmission with a constant power, and the constant power is obtained through constant current and/or constant voltage provided by the bandgap circuit 501. It is to be understood that SerDes apparatus 500 includes additional components, and some of which may also rely on constant current or constant voltage.

Upon reading this disclosure, those of skill in the art will appreciate still additional alternative designs. Thus, while particular embodiments and applications of the present disclosure have been illustrated and described, it is to be understood that the embodiments are not limited to the precise construction and components disclosed herein and that various modifications, changes and variations which will be apparent to those skilled in the art may be made in the arrangement, operation and details of the method and apparatus of the present disclosure disclosed herein without departing from the spirit and scope of the disclosure as defined in the appended claims.

What is claimed is:
1. A SerDes apparatus comprising:
  a bandgap circuit configured to generate an output voltage, the bandgap circuit comprising a resistor ladder including a plurality of resistors connected in series, the resistor ladder connected across the output voltage and ground, and configured to output a plurality of voltages across the plurality of resistors, respectively; the bandgap circuit further comprising a current source configured to supply a constant current;
  a first phase-lock loop (PLL) configured to generate a first reference clock signal using a first voltage of the plurality of voltages;
  an equalizer for processing an incoming data stream, the equalizer being coupled to the current source supplying the constant current to the equalizer; and a second phase-lock loop (PLL) configured to generate a second reference clock signal using the first voltage of the plurality of voltages.

2. The SerDes apparatus of claim 1 further comprising a transmitter coupled to the output voltage.

3. The SerDes apparatus of claim 1 wherein the equalizer comprises a continuous time linear equalizer.

4. The SerDes apparatus of claim 1 wherein the resistor ladder includes a plurality of taps, each tap of the plurality of taps connected to one of the plurality of resistors of the resistor ladder and outputting one of the plurality of voltages, the bandgap circuit further comprising an output switch configured to connect a first tap of the plurality of taps outputting the first voltage to the first and second PLLs.

5. The SerDes apparatus of claim 1 wherein the bandgap circuit further comprises a semiconductor device configured to supply a first current to the bandgap circuit and a second current to the resistor ladder, and wherein the semiconductor device is coupled to a power supply.

6. The SerDes apparatus of claim 5, wherein the semiconductor device is a bipolar junction transistor.

7. The SerDes apparatus of claim 5, wherein the semiconductor device is a metal-oxide semiconductor field-effect transistor.

8. The SerDes apparatus of claim 1 wherein the output voltage is independent of temperature.

9. The SerDes apparatus of claim 1 wherein the current source is configured to supply the constant current independently of temperature.

10. The SerDes apparatus of claim 1 further comprising a digital to analog converter (DAC) comprising a binary weighted current ladder coupled to the current source.

* * * * *